United States Patent
Kang et al.

(10) Patent No.: US 11,678,448 B2
(45) Date of Patent: Jun. 13, 2023

(54) ELECTRONIC DEVICE AND CONNECTION DEVICE

(71) Applicant: Lenovo (Beijing) Co., Ltd., Beijing (CN)

(72) Inventors: Yangtao Kang, Beijing (CN); Dikang Chen, Beijing (CN)

(73) Assignee: LENOVO (BEIJING) CO., LTD., Beijing (CN)

( * ) Notice: Subject to any disclaimer, the term of this patent is extended or adjusted under 35 U.S.C. 154(b) by 162 days.

(21) Appl. No.: 16/833,979

(22) Filed: Mar. 30, 2020

(65) Prior Publication Data

US 2020/0315047 A1 Oct. 1, 2020

(30) Foreign Application Priority Data

Mar. 30, 2019 (CN) .......................... 201910253905.2

(51) Int. Cl.
*H05K 5/02* (2006.01)
*H05K 5/00* (2006.01)
*G06F 1/16* (2006.01)
*E05D 3/06* (2006.01)

(52) U.S. Cl.
CPC ......... *H05K 5/0226* (2013.01); *G06F 1/1616* (2013.01); *G06F 1/1681* (2013.01); *H05K 5/0017* (2013.01); *E05D 3/06* (2013.01); *E05Y 2900/606* (2013.01)

(58) Field of Classification Search
CPC ... G06F 1/1616; G06F 1/1681; H05K 5/0017; H05K 5/0226
See application file for complete search history.

(56) References Cited

U.S. PATENT DOCUMENTS

| 9,128,664 | B1* | 9/2015 | Tabone | G06F 1/1654 |
| 9,598,886 | B2* | 3/2017 | Kasai | E05D 3/12 |
| 10,564,682 | B1* | 2/2020 | Wu | H05K 5/0226 |
| 2010/0064536 | A1* | 3/2010 | Caskey | G06F 1/1694 |
| | | | | 33/303 |
| 2012/0057280 | A1* | 3/2012 | Hoshino | H05K 5/0017 |
| | | | | 361/679.01 |
| 2012/0147535 | A1* | 6/2012 | Ahn | G06F 1/1615 |
| | | | | 361/679.01 |
| 2013/0170124 | A1* | 7/2013 | Pan | G06F 1/1688 |
| | | | | 361/679.01 |

(Continued)

FOREIGN PATENT DOCUMENTS

| CN | 102541177 A | 7/2012 |
| CN | 104080288 A | 10/2014 |

(Continued)

*Primary Examiner* — Rockshana D Chowdhury
*Assistant Examiner* — Douglas R Burtner
(74) *Attorney, Agent, or Firm* — Anova Law Group, PLLC

(57) ABSTRACT

An electronic device includes a first body, a second body, and a connection device. The first body has a first surface. A first display device is placed at the first surface. The second body has a second surface, and a second display device is placed at the second surface. The connection device configured to rotatably connect the first body and the second body. The electronic device has a first position. At the first position, the first surface and the second surface face a same direction, and the connection device is under a display surface formed by the first surface and the second surface and not exposed at the display surface.

11 Claims, 12 Drawing Sheets

(56) References Cited

U.S. PATENT DOCUMENTS

| | | | | |
|---|---|---|---|---|
| 2014/0098188 A1* | 4/2014 | Kwak | ............ | G06F 3/1423 |
| | | | | 348/38 |
| 2014/0290009 A1* | 10/2014 | Kasai | ............ | E05D 3/12 |
| | | | | 16/386 |
| 2015/0244940 A1* | 8/2015 | Lombardi | ............ | H04N 23/695 |
| | | | | 348/333.06 |
| 2015/0257289 A1* | 9/2015 | Lee | ............ | H05K 5/0017 |
| | | | | 361/749 |
| 2016/0302316 A1* | 10/2016 | Jeong | ............ | H05K 5/0226 |
| 2019/0029135 A1* | 1/2019 | Park | ............ | G06F 1/1616 |
| 2019/0208649 A1* | 7/2019 | Jeon | ............ | G06F 1/1641 |
| 2019/0364682 A1* | 11/2019 | Kikuchi | ............ | H05K 5/0226 |
| 2020/0163239 A1* | 5/2020 | Yun | ............ | G06F 1/1652 |
| 2020/0323091 A1* | 10/2020 | Nagai | ............ | H04M 1/022 |
| 2021/0018960 A1* | 1/2021 | Kato | ............ | G06F 1/1681 |

FOREIGN PATENT DOCUMENTS

| | | |
|---|---|---|
| CN | 104932608 A | 9/2015 |
| CN | 108292148 A | 7/2018 |
| CN | 109313469 A | 2/2019 |
| WO | 2019028708 A1 | 2/2019 |

\* cited by examiner

ELECTRONIC DEVICE AND CONNECTION DEVICE

CROSS-REFERENCE TO RELATED APPLICATION

This application claims priority to Chinese Patent Application No. 201910253905.2, filed on Mar. 30, 2019, the entire content of which is incorporated herein by reference.

TECHNICAL FIELD

The present disclosure relates to the technical field of electronics and, more particularly, to a connection device and an electronic device.

BACKGROUND

Some electronic devices can have two displays rotatably connected by a rotating shaft mechanism. By using the rotating shaft mechanism, the two displays rotate relatively to change display forms and display areas of the electronic devices. The existing shaft rotating mechanism drives the two displays to rotate relative to each other. When the two displays rotate to a same plane (i.e., rotate to 180°), often a relatively large gap is formed between the two displays due to the configuration of the rotating shaft mechanism. This negatively affects the usability of the electronic devices.

SUMMARY

Embodiments of the present disclosure provide an electronic device including a first body, a second body, and a connection device. An electronic device includes a first body, a second body, and a connection device. The first body has a first surface. A first display device is placed at the first surface. The second body has a second surface, and a second display device is placed at the second surface. The connection device configured to rotatably connect the first body and the second body. The electronic device has a first position. At the first position, the first surface and the second surface face a same direction, and the connection device is under a display surface formed by the first surface and the second surface and not exposed at the display surface.

Embodiments of the present disclosure provide a connection device including a shaft, an axial movement mechanism, and a radial movement mechanism. The shaft is configured to rotatably connect a first body and a second body. The axial movement mechanism is configured at the shaft and driven by the shaft to move along an axis of the shaft. The radial movement mechanism connects the axial movement mechanism to the first body and moves along a radius of the shaft driven by the axial movement mechanism.

BRIEF DESCRIPTION OF THE DRAWINGS

In FIG. 1-FIG. 12, reference numerals:
1—first body, 2—second body, 3—first surface, 4—second surface, 5—connection device, 6—first partial accommodation structure, 7—second partial accommodation structure, 8—third surface, 9—fourth surface, 10—first wall surface, 11—second wall surface, 12—decoration piece, 13—shaft, 14—mounting piece, 15—first axial movement piece, 16—second axial movement piece, 17—first protrusion block, 18—first sliding slot, 19—connection piece, 20—shaft sleeve, 21—annular grove, 22—lever, 23—pin shaft, 24—radial movement piece, 25—torque structure, 26—first sliding structure, 27—second sliding structure.

DETAILED DESCRIPTION OF THE EMBODIMENTS

Figure 1:
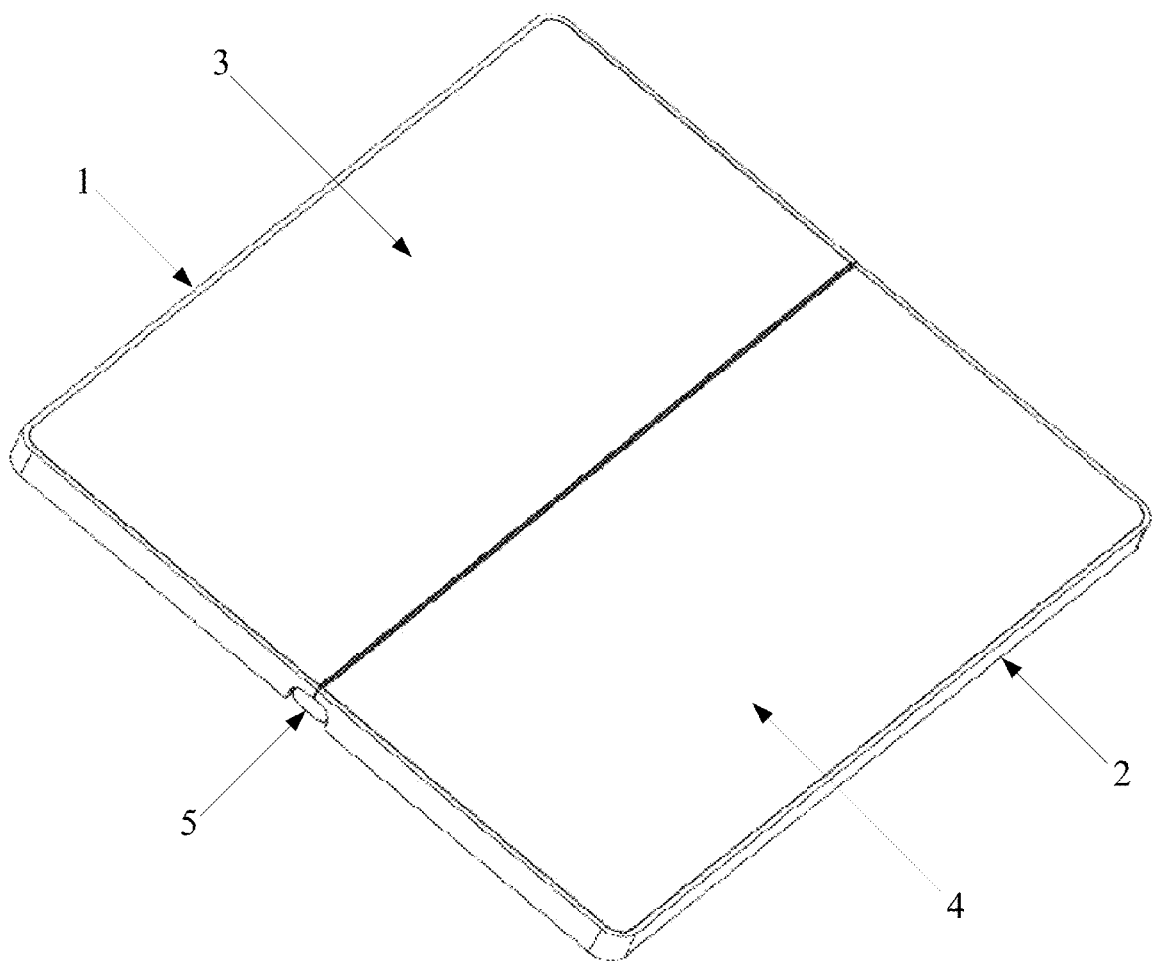
FIG. 1 is an isometric view of an electronic device at a first position according to the embodiments of the present disclosure.
Figure 2:
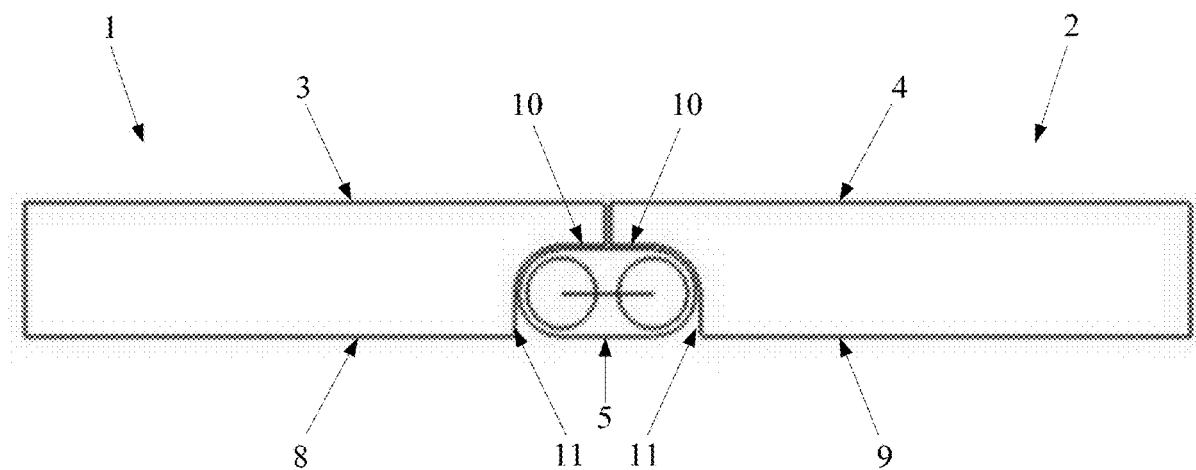
FIG. 2 is a main view of the electronic device of FIG. 1.

The present disclosure provides an electronic device, which can reduce a gap between two display parts to significantly improve the display effect.

The embodiments of the present disclosure are described in connection with the accompanying drawings. In some embodiments of the present disclosure. The described embodiments are merely some embodiments of the present disclosure, but not all the embodiments. Based on the embodiments of the present disclosure, all other embodiments obtained by those of ordinary skill in the art without any creative effort are within scope of the present disclosure.

As shown in FIG. 1 to FIG. 12, the present disclosure provides an electronic device, which has a first body 1 and a second body 2 rotatably connected by a connection device 5. The first body 1 and the second body 2 are plate structures. A first display device is placed at a first surface 3 of the first body 1, and a second display device is placed at a second surface 4 of the second body 2. The first body 1 and the second body 2 rotate relative to each other through the connection device 5, such that the electronic device at least has a first position. In the present disclosure, when an angle between the first body 1 and the second body 2 is 180°, a position of the electronic device is referred to as the first position. When the electronic device is at the first position, the first body 1 and the second body 2 satisfy a parallel condition. A parallel condition means that the reference planes of the two bodies are parallel or substantially parallel, and the reference planes can be center planes or one side surfaces of the first body 1 and second body 2. The orientations of the first surface 3 and the second surface 4 can satisfy a same condition, which means that the first surface 3 and the second surface 4 face a same direction, e.g., both face up or face down. At this position, the connection device 5 is under a display surface formed by the first surface 3 and the second surface 4. That is, the connection device 5 is at an opposite direction of the first surface 3 and the second surface 4. The connection device 5 is covered by the first surface 3 and the second surface 4, such that the connection device 5 does not expose to the surface, that is, most of the connection device, e.g., 80% of the structure, is not exposed. In some embodiments, the structure of the connection device is completely not exposed, i.e., 100% of the structure is not exposed. As such, the display surface formed by the first surface 3 and the second surface 4 can produce the visual effect of a complete display surface. When the edge of the first display device is at the edge of the first body 1, and the edge of the second display device is at the edge of the second body 2, a complete display surface can be formed by the first display device and the second display device, such that the electronic device has a visual effect of a complete screen.

In the above-mentioned structure, the first display device and the second display device may be two display screens installed at the first surface 3 and the second surface 4, respectively, and may also be two components of a flexible display device. That is, one component of the flexible display device is placed at the first surface 3, and after cross the connection device 5, the other component is placed at the second surface 4. A position aligned to the connection device 5 can be folded to satisfy the requirement that the first body 1 and the second body 2 can rotate relative to each other.

Under a condition that the connection device 5 is not exposed at the display surface, to better facilitate the operations of the connection device 5 with the first body 1 and the second body 2, and at the same time, to improve appearance aesthetics of the electronic device, as shown in FIG. 2 to FIG. 5, in some embodiments, a first partial accommodation structure 6 close to a first end of the connection device 5 at the first body 1, and a second accommodation structure 7 close to a second end of the connection device 5 at the second body 2 can be used. When the electronic device is at the first position, the first partial accommodation structure 6 and the second partial accommodation structure 7 form an accommodation groove to accommodate the connection device 5. That is, when the angle between the first body 1 and the second body 2 is 180°, the connection device 5 is housed by the accommodation groove, such that the connection device 5 does not protrude relative to the first body 1 and the second body 2. The first end is an end where the first body 1 is connected to the connection device 5. The second end is an end where the second body 2 is connected to the connection device 5. Based on the above-mentioned structure, the first body 1 and the second body 2 also form a bottom wall of the accommodation groove, which covers the connection device 5 at the accommodation groove, such that the connection device 5 is not exposed at the display surface. That is, a configuration of the accommodation groove not only improves the operations of the connection device 5 with the first body and the second body 2 and the appearance aesthetics of the electronic device, but also forms a structure (i.e., formed a bottom wall) to cover the connection device 5, such that no shielding component is needed. This further simplifies the structure of the electronic device.

The space formed by the first partial accommodation structure 6 and the second partial accommodation structure 7, may also be understood as an accommodation space opened at the first body 1 and the second body 2 to facilitate the connection device 5 to work better. At the same time, in some embodiments, the connection device 5 is a rotating shaft mechanism, which can let the first body 1 and the second body 2 rotate relatively in a range of 0° to 360°. The rotating shaft mechanism is a dual-axis linkage mechanism.

Since the dual-axis linkage mechanism is symmetrical, in some embodiments, for a better cooperation with the dual-axis linage mechanism, the first partial accommodation structure 6 and the second partial accommodation structure 7 may have the same structure. At the first position, the first partial accommodation structure 6 and the second accommodation structure 7 may be symmetrically arranged relative to the symmetrical line of the dual-axis linkage mechanism. As shown in FIG. 2 to FIG. 5, a half structure of the accommodation groove is formed by the first partial accommodation structure 6, and the other half structure of the accommodation groove is formed by the second partial accommodation structure 7.

In FIG. 2 to FIG. 5, in some embodiments, a surface of the first body 1, which is opposite to the first surface 3, is referred to as a third surface 8, and a surface of the second body 2, which is opposite to the second surface 4, is referred to as a fourth surface 9. At the first end, the third surface 8 is shorter than the first surface 3 to form the first partial accommodation structure 6, and at the second end, the fourth surface 9 is shorter than the second surface 4 to form the second partial accommodation structure 7. To facilitate understanding, the first partial accommodation structure 6 and the second partial accommodation structure 7 can be understood as being formed by cutting parts of a corner of the third surface 8 and a corner of the fourth surface 9, respectively. In some embodiments, shapes of the first partial accommodation structure 6 and the second partial accommodation structure 7 are L-shapes, and bend positions of the L-shapes are rounded.

In some embodiments, the electronic device further has a second position different from the first position. During a process that the electronic device transitions from the second position to the first position, the connection device 5 causes the first body 1 or the second body 2 to rotate, and at the same time, cause a distance between the first body 1 or the second body 2 to decrease, such that the first body 1 and the second body 2 approach to each other. In the prior art, a gap formed between the first body 1 and the second body 2 by configuring the connection device 5. In some embodiments, a method for eliminating the gap is that, when the first body 1 and the second body 2 rotate relative to each other, at the same time, the first body 1 and the second body 2 also move relative to each other, such that when the first body 1 and the second body 2 rotate to the first position (i.e., when the angle between the first body 1 and the second body 2 is) 180°, the gap between the first body 1 and the second body 2 can be reduced and even eliminated to join the two bodies and achieve a visual effect of a display screen of a relative large area for the electronic device.

The second position refers to a position where the angle between the first body 1 and the second body 2 is not 180°. In some embodiments, when the first body 1 and the second body 2 are parallel to each other the position is referred to as the second position, i.e., when the angle between the first body 1 and the second body 2 is 0° or 360°. Since the distance between the first body 1 and the second body 2 is the smallest when the angle is at 180°, when the first body 1 and the second body 2 rotate from other degrees to 180°, the first body 1 and the second body 2 is close each other, otherwise the first body 1 and the second body 2 is away from each other.

Further, the connection device 5 is a rotating shaft mechanism. That is, the connection device 5 includes a shaft 13. To better join the first body 1 and the second body 2, during the process that the electronic device transitions from the second position to the first position, the first body 1 or the second body 2 move both in radial direction of the shaft 13 (i.e., the first body 1 and the second body 2 approach to each other or depart from each other) and away from the display surface. Since there is no specific technical requirement for the connection device 5 to avoid the display surface for electronic devices, in some situations, the first body 1 and the second body 2 to approaching each other cannot eliminate the gap completely for the electronic device to form a complete display screen. Therefore, to ensure a better display effect, the embodiments of the present disclosure move the first body 1 and the second body 2 close to each other, and at the same time, move connection device relative to the display surface. Embodiments of the present disclosure form a complete display screen using the first display device and the second display device, and move the connection device 5 away from the display surface to prevent the connection device 5 from interfering the merger of the first surface 3 and the second surface 4. Embodiments of the present disclosure implement join the first body 1 and the second body 2 and the first surface 3 and the second surface 4.

As shown in FIG. 2 to FIG. 5, the first partial accommodation structure 6 and the second partial accommodation structure 7 are both surrounded by first wall surfaces 10 and second wall surfaces 11. Based on this structure, in some embodiments, the electronic device further has a third position, which is different from the first position. In some embodiments, the third position may be a position when the angle between the first body 1 and the second body 2 is 0°, and correspondingly, the above-mentioned second position is a position when the angle between the first body 1 and the second body 2 is 360°. When the electronic device is at the third position, the first partial accommodation structure 6 and the second partial accommodation structure 7 can also form an accommodation groove to accommodate the connection device 5. A method for forming the accommodation groove is different from the method for forming the accommodation groove at the first position. That is, at the first position, the first wall surfaces 10 of the first partial accommodation structure 6 and the second partial accommodation structure 7 form the bottom wall of the accommodation groove, and the second wall surface 11 of the first partial accommodation structure 6 and the second wall surface 11 of the second partial accommodation structure 7 form two side walls opposite to each other, respectively. At the third position, the second wall surfaces 11 of the first partial accommodation structure 6 and the second partial accommodation structure 7 form a bottom wall of the accommodation groove, and the first wall surface 10 of the first partial accommodation structure 6 and the first wall surface 10 of the second partial accommodation structure 7 form two side walls opposite to each other, respectively. In short, through the relative rotation of the first body 1 and the second body 2, at the third position, the bottom wall of the accommodation groove is formed by the two side walls of the accommodation groove at the first position. At the third position, the side walls of the accommodation groove are formed by splitting the bottom wall of the accommodation groove at the first position.

Figure 5:
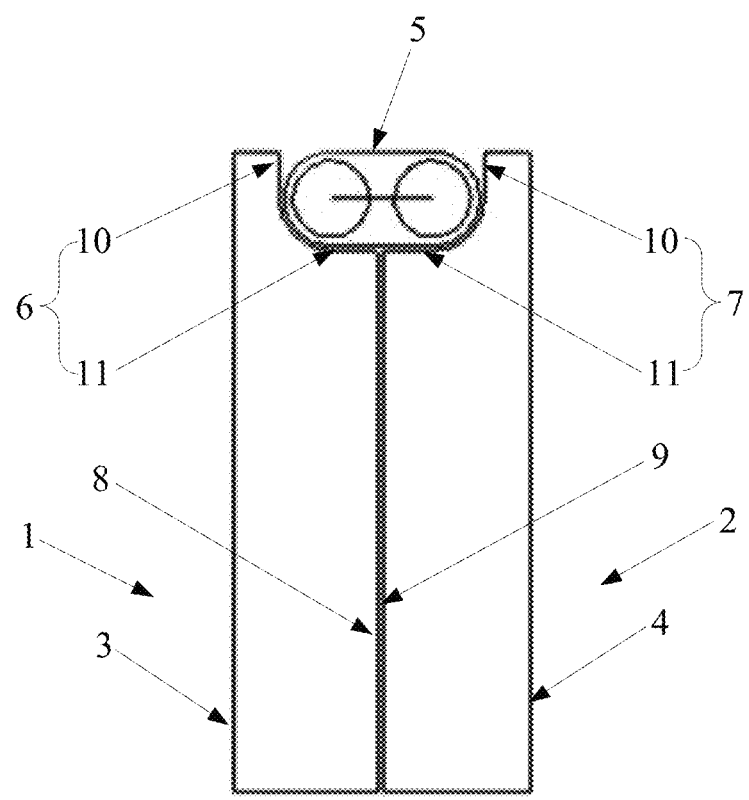
FIG. 5 is a main view of the electronic device at a third position.
Figure 6:
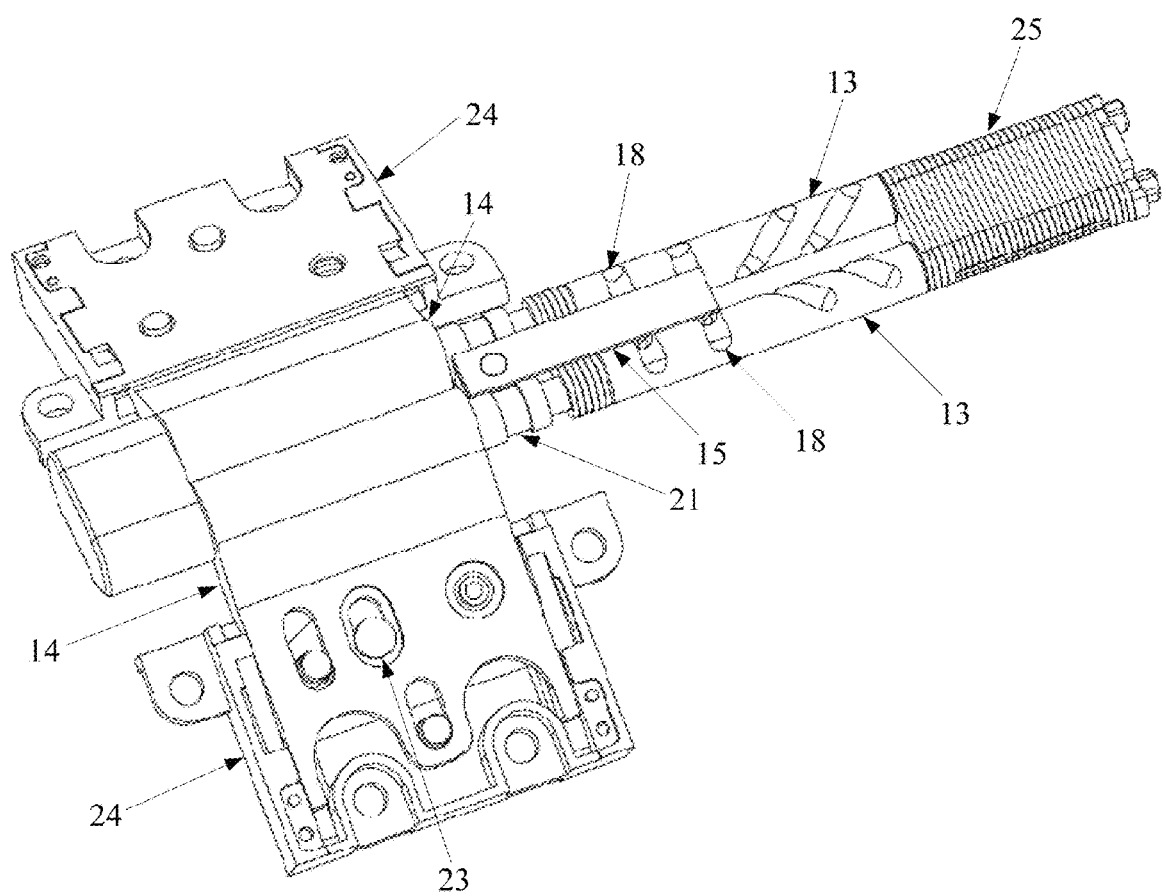
FIG. 6 is an assembly diagram of a connection device, an axial movement mechanism, and a radial movement mechanism.

In some embodiments, the two accommodation grooves are described as follows. When the first surface 3 and the second surface 4 face a same direction, and the first surface 3 and the second surface 4 are opposite to each other (when the angle of the first body 1 and the second body 2 is 0°, the first surface 3 and the second surface 4 are opposite to each other, as shown in FIG. 5), the first partial accommodation structure 6 and the second partial accommodation structure 7 both can form the accommodation groove to accommodate the connection device 5, that is, when the first surface 3 and the second surface 4 face to the same direction, the first wall surfaces 10 of the first partial accommodation structure 6 and the second partial accommodation structure 7 form the bottom wall of the accommodation groove, and the second wall surface 11 of the first partial accommodation structure 6 and the second wall surface 11 of the second partial accommodation structure 7 form the two side walls of the accommodation groove opposite to each other, respectively. When the first surface 3 and the second surface 4 are opposite to each other, the second wall surfaces 11 of the first partial accommodation structure 6 and the second partial accommodation structure 7 form the bottom wall of the accommodation groove, and the first wall surface 10 of the first partial accommodation structure 6 and the second wall surface 10 of the second partial accommodation structure 7 form the two side walls of the accommodation groove opposite to each other, respectively.

The electronic device provided by the embodiments can form the accommodation grooves at the two positions to accommodate the connection device 5 at the first body 1 and the second body 2 at the two positions and improve the appearance aesthetics of the electronic device. In some embodiments, the reason to accommodate the connection device 5, when the electronic device is at a closed state of 0° and at a flat state of 180°, is that the two states are two most common states of a dual-screen electronic device and two most used states by the users. To accommodate the connection device 5 in these two situations, embodiments of the present disclosure improve user experience of the electronic device.

In some embodiments, the first partial accommodation structure 6 and the second partial accommodation structure 7 have the same structure and both are surrounded by the first wall surfaces 10 and the second wall surfaces 11. The first surfaces 10 and the second surfaces 11 are at least partially perpendicular to each other. That is, the first partial accommodation structure 6 and the second partial accommodation structure 7 are L-shapes, and the bend positions of the L-shapes are rounded. Regarding the dimension, lengths of the first wall surfaces 10 forming the bottom wall of the accommodation groove are not shorter than a half cross-section length of the connection device 5, and lengths of the second wall surfaces 11 forming the side walls of the accommodation groove are not shorter than the lengths of the first wall surfaces 10 and a cross-section width of the connection device 5. In some embodiments, to work with the dual-axis linkage mechanism having a sectional shape close to oval, the length of the second wall surface 11 (i.e., a depth of the accommodation groove, and also a dimension of the accommodation space formed by cutting between the first surface 3 and the third surface 8 or between the second surface 4 and the fourth surface 9) is a length of an oval minor axis (the minor axis is the cross-section width of the connection device 5), and the length of the first wall surface 10 (i.e., a half width of the accommodation groove, and also a length of a component to cover the connection device 5, and at the same time, a sum of a length of the third surface 8 shorter than the first surface 1 and a length of the fourth surface 9 shorter than the second surface 4) is a length of an oval semi-major axis (the length of the oval major axis is a cross-section length of the connection device 5).

The first partial accommodation structure 6 and the second partial accommodation structure 7 with the above-mentioned shape and dimension can be coupled with the connection device 5. The gap between the components is minimized to improve the performance of the electronic device.

As shown in FIG. 6 to FIG. 12, In some embodiments, the connection device 5 includes the above mentioned shaft 13 configured to rotatably connect the first body 1 and the second body 2. An axial movement mechanism configured at the shaft 13 and driven by the shaft 13 may move forward and backward along an axis of the shaft 13. A radial movement mechanism, which connects the axial movement mechanism and the first body 1 and is driven by the axial movement mechanism, can move forward and backward along a radius of the shaft 13. The radial movement mechanism is configured at a mounting piece 14, which is fixed to the shaft 13. Further, the first body 1 and the second body 2 of the electronic device can rotate relative to each other and at the same time move relative to each other. A structure, which realizes this function, is the axial movement mechanism configured at the shaft 13 and the radial movement mechanism connected to the axial movement mechanism. When the first body 1 and the second body 2 rotate relative to each other, the shaft 13 rotates driven by the first body 1 and the second body 2, and the axial movement mechanism configured at the shaft 13 moves along an axial direction driven by the rotating shaft 13, such that the radial movement mechanism moves along the radius of the shaft 13 driven by the axial movement mechanism. Because the first body 1 or the second body 2 is connected to the radial movement mechanism, the radial movement mechanism can drive the first body 1 or the second body 2 to approach to or move away from the shaft 13, such that the first body 1 and the second body 2 move relative to each other.

Figure 9:
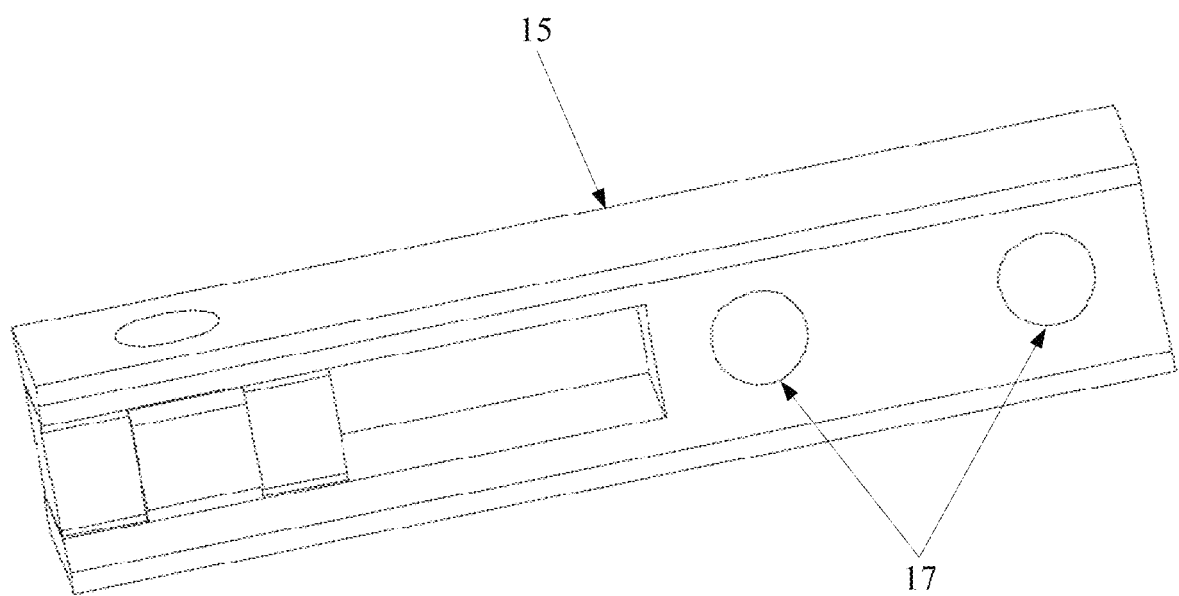
FIG. 9 is a schematic structural diagram of a first axial movement piece.
Figure 10:
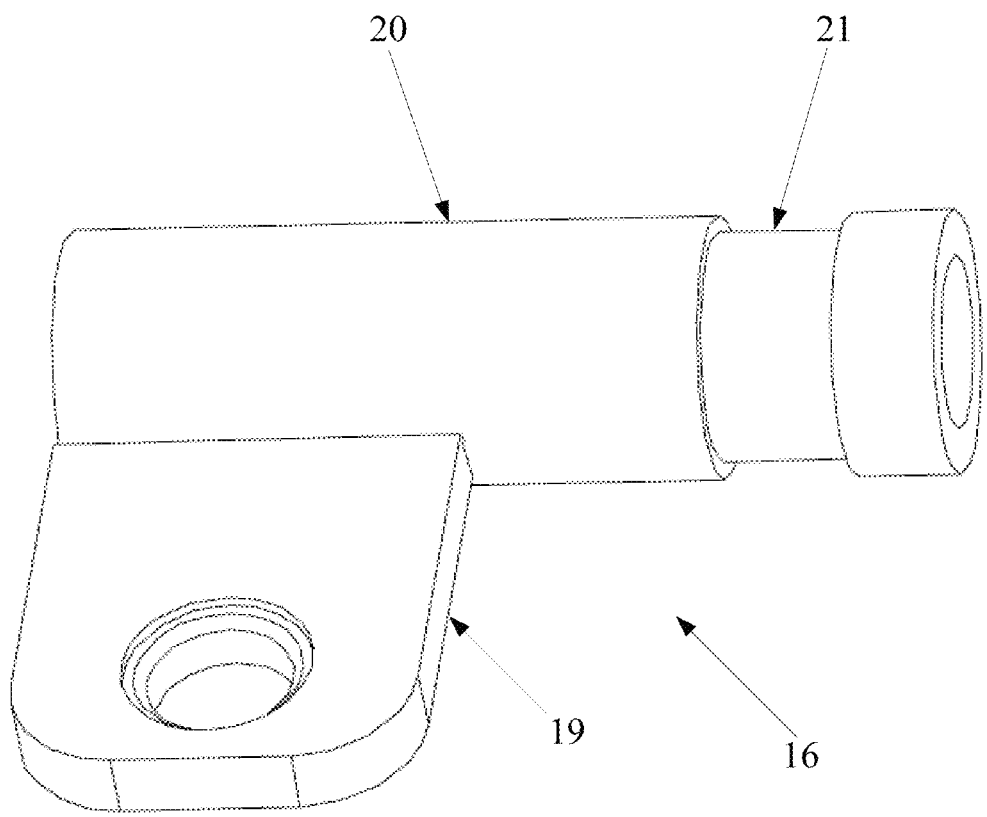
FIG. 10 is a schematic structural diagram of a second axial movement piece.

In some embodiments, as shown in FIG. 6 to FIG. 12, the radial movement mechanism includes a first radial movement piece 15 and a second radial movement piece 16. Both are provided at the shaft 13. A first protrusion block 17 protrudes and is placed at the first radial movement piece 15, and a first sliding slot 18 is opened at a circumstantial surface of the shaft 13 to couple with the first protrusion block 17. At least a part of the first sliding slot 18 is obliquely configured relative to the axis of the shaft 13. When the shaft 13 rotates, the first protrusion block 17 is driven by the rotating first sliding slot 18 to slide at the first sliding slot 18, such that the first radial movement piece 15 is driven by the first protrusion block 17 to move along the axis of the shaft 13 (when the shaft 13 rotates in a single direction, the first axial movement piece 15 also rotates in a single direction). Since the first axial movement piece 15 is connected to the radial movement mechanism through the second axial movement piece 16, the second axial movement mechanism can be pulled by the first axial movement mechanism 15 to drive the radial movement mechanism to move. In some embodiments, the first axial movement piece is a bar-shaped block. As shown in FIG. 9, a surface of the bar-shaped block, which cooperates with the shaft 13, is a concave curved surface. The first protrusion block 17 protrudes and is placed at the concave curved surface. When the connection device 5 is the dual-axis linkage mechanism, that is, when the connection device 5 has two shafts 13, the first axial movement piece 15 is arranged and supported between the two shafts 13. Two surfaces of the first axial movement piece 15 both are the concave curved surfaces. The first protrusion blocks 17 are placed on the concave curved surfaces and coupled slidably with the first sliding slots 18 of the two shafts 13. The second axial movement piece 16 is slidably sleeved over the shaft 13. The second axial movement piece 16 includes a connection part 19 radially extending relative to the shaft 13 and an axis sleeve part 20 sleeved over the shaft 13. An annular groove 21 is placed at a circumstantial surface of the axis sleeve part 20 to engage with the first axial movement piece 15. Through an engagement of the annular groove 21 and the first axial movement piece 15, the second axial movement piece 16 can be driven by the first axial movement piece to move axially and rotate relative to the first axial movement piece 15. In this configuration, the connection part 19 of the second axial movement piece 16 is connected to the radial movement mechanism, and the radial movement mechanism is connected to the first body 1 or the second body 2, so the second axial movement piece 16 connected to the first body 1 or the second body 2 is can rotate with the shaft 13. The first axial movement piece 15 can only move axially. Therefore, the second axial movement piece 16 and the shaft 13 not only are rotatably connected to each other but also can move axially.

Figure 11:
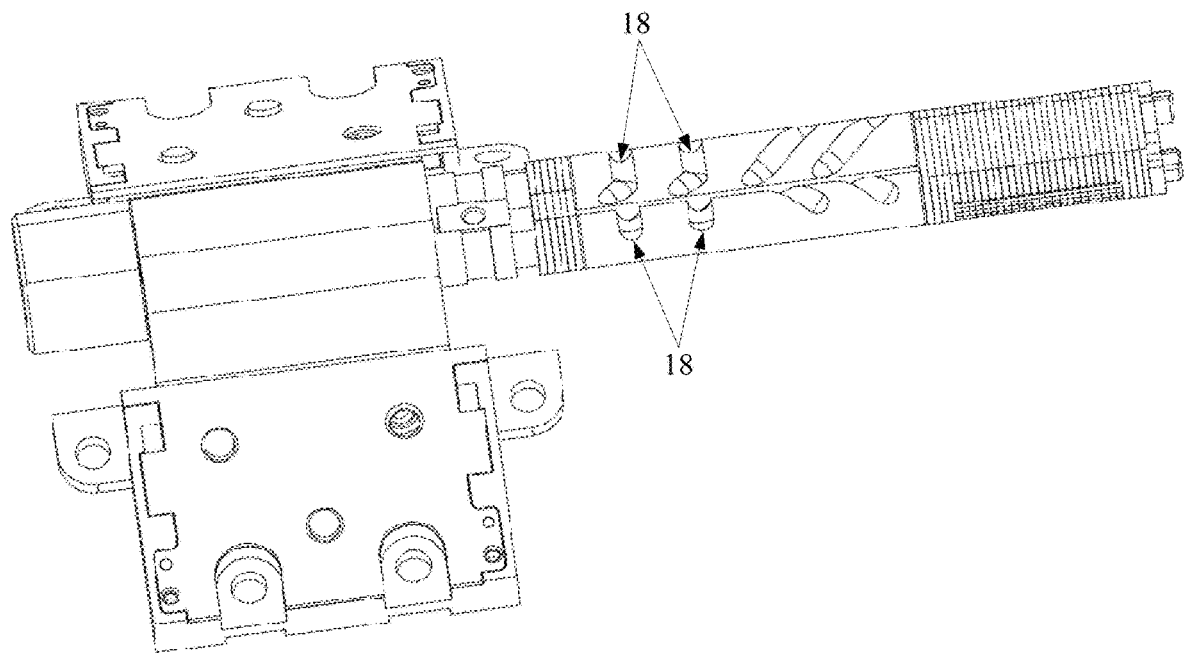
FIG. 11 is a schematic structural diagram of a first sliding slot.

In some embodiments, the first sliding slot 18 of the above-mentioned axial movement mechanism, which is placed at the circumstantial surfaces of the shaft 13, is obliquely configured relative to the axis of the shaft 13, so that the first axial movement piece 15 and the second axial movement piece 16 can move continuously and axially when the shaft 13 rotates. In some embodiments, only a part of the first sliding slot 18 is obliquely configured relative to the axis of the shaft 13, that is, a part of the first sliding slot 18 is a tilted section, but the rest part of the first sliding slot 18 is configured perpendicularly (i.e., perpendicular section) to the axis of the shaft 13. As shown in FIG. 11, the first protrusion block 17 can drive the first axial movement piece 15 and the second axial movement piece 16 to move axially only when the first protrusion block 17 is at the tilted section. The first body 1 and the second body 2 do not move relative to each other when the first body 1 and the second body 2 rotate in a certain angular range. For example, when the first body 1 and the second body 2 rotate relative to each other in a range of 0° to 60°, the first protrusion block 17 slides at the perpendicular section. The first body 1 and the second body 2 only rotate relative to each other but do not move relative to each other. When the first body 1 and the second body 2 rotate relative to each other in a range of 60° to 180°, the first protrusion block 17 slides at the tilted section. The first body 1 and the second body 2 not only rotate relative to each other but also move closer to each other. The connection device 5 is the dual-axis linkage mechanism, which facilitates the first body 1 and the second body 2 to rotate 360° relative to each other. The first sliding slot 18 includes a first perpendicular section, a first tilted section connected to the first perpendicular section, a second tilted section connected to the first tilted section, and a second perpendicular section connected to the second tilted section. The first perpendicular section and the second perpendicular section are arranged symmetrically about the axis of the shaft 13, and the first tilted section and the second tilted section are arranged symmetrically about the axis of the shaft 13, such that, when the first body 1 and the second body 2 rotate in a range of 180° to 240°, the first body 1 and the second body 2 rotate relative to each other and move away from each other. When the first body 1 and the second body 2 rotate relative to each other in a range of 240° to 360°, the first body 1 and the second body 2 only rotate relative to each other but do not move relative to each other. The above-mentioned process is a process for opening the electronic device from 0° to 360°, when the electronic device is closed from 360° to 0°, the first body 1 and the second body 2 make reverse movements compared to the aforementioned process.

Figure 7:
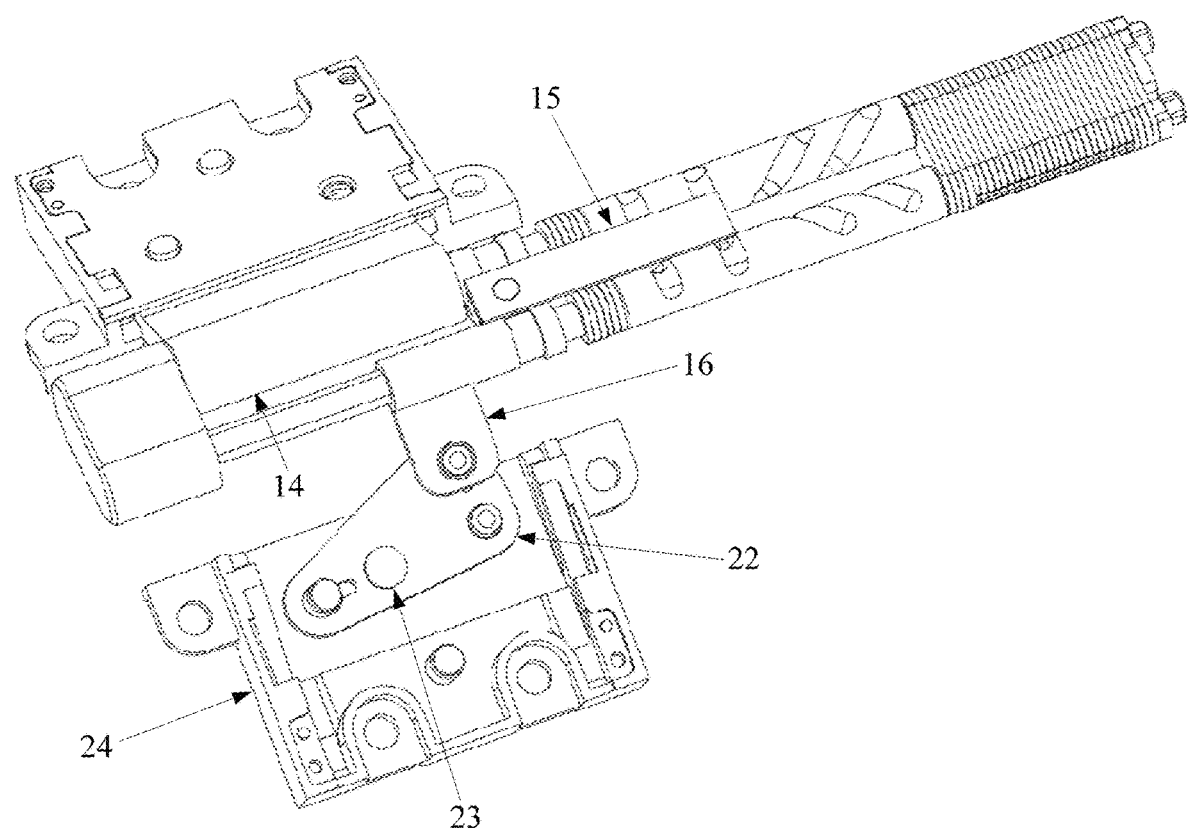
FIG. 7 is a schematic structural diagram of the coupling between the axial movement mechanism and the radial movement mechanism.
Figure 8:
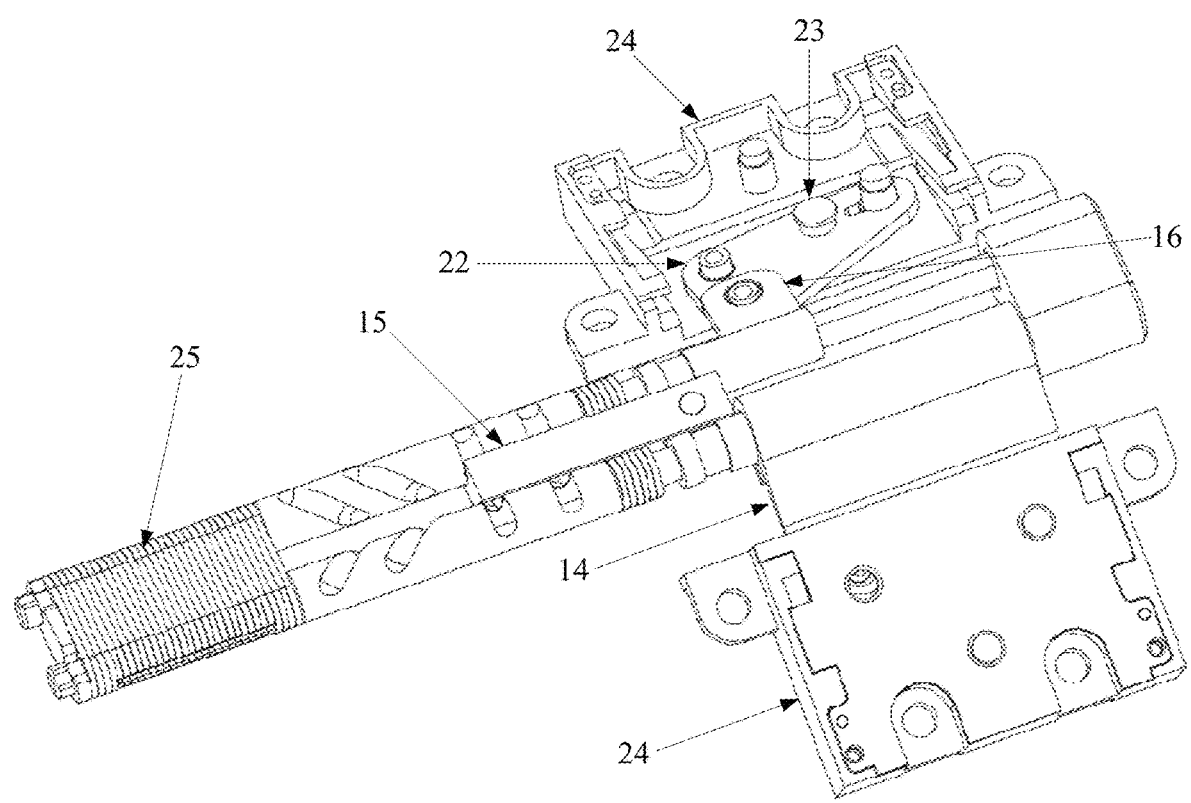
FIG. 8 is a schematic structural diagram of a corner of FIG. 7.

As shown in FIG. 7, the radial movement mechanism includes a lever 22 and a radial movement piece 24. The lever 22 is rotatably placed at the mounting piece 14, and one end of the lever 22 is hinged with the second axial movement piece 16. The radial movement piece 24 is slidably connected to the mounting piece 14 and hinged with the other end of the lever 22. The axial movement piece drives the lever 22 to rotate, which causes the radial movement piece 24 driven by the lever 22 to move forward and backward along a radius of the shaft 13, such that the first body 1 and the second body 2 are driven by the radial movement piece 24 to move away or approach the shaft 13. The lever 22 is a component used to change an axial movement to a radial movement, which is rotatably configured at the mounting piece 14 through a pin shaft 23. When the second axial movement piece 16 connected to the end of the lever 22 drives the lever 22 to rotate through the axial movement, the radial movement piece 24 connected to the other end of the lever 22 moves in the radial direction driven by the rotation of the lever 22. The first body 1 or the second body 2 approach or move away relative to the shaft 13 through the movement of the first body 1 or the second body 2 driven by the radial movement piece 24. Similarly, during a process that the shaft 13 rotates in a single direction, the radial movement piece 24 also moves in a single direction.

Further, as shown in FIG. 6-FIG. 12, the connection part 19 of the second axial movement piece 16 is a plate structure. The lever 22 is a triangle-shaped plate piece. The mounting piece 14 and the radial movement piece 24 are both groove-shaped pieces.

In some embodiments, as shown in FIG. 6-FIG. 12, when the connection device 5 is the dual-axis linkage mechanism, the shaft 13 includes a first shaft and a second shaft that are parallel to each other. The first shaft is connected to the first body 1, and the second shaft is connected to the second body 2. There is a linkage structure and a torque structure 25 configured between the first shaft and the second shaft. The first shaft and the second shaft share the same first axial movement piece 15. The second axial movement piece 16, the mounting piece 14, and the radial movement mechanism are configured between the first shaft and the first body 1, and between the second shaft and the second body 2. With this configuration, both the first body 1 and the second body 2 can rotate and move relative to each other, so that the moving stroke of the first body 1 and the second body 2 can be reduced, and the joint operation of the first body 1 and the second body 2 is better. This configuration structure can make the structure layout more reasonable and the movement of the components smoother. The linkage structure of the above-mentioned structure has a same working principle as that of the first axial movement piece 15 and the shaft 13. That is, the protrusion block slidably couples with the sliding slot to transfer force. The torque structure 25 is formed by a plurality of friction plates, which are stacked over each other and are simultaneously passed through by the two shafts 13.

Figure 3:
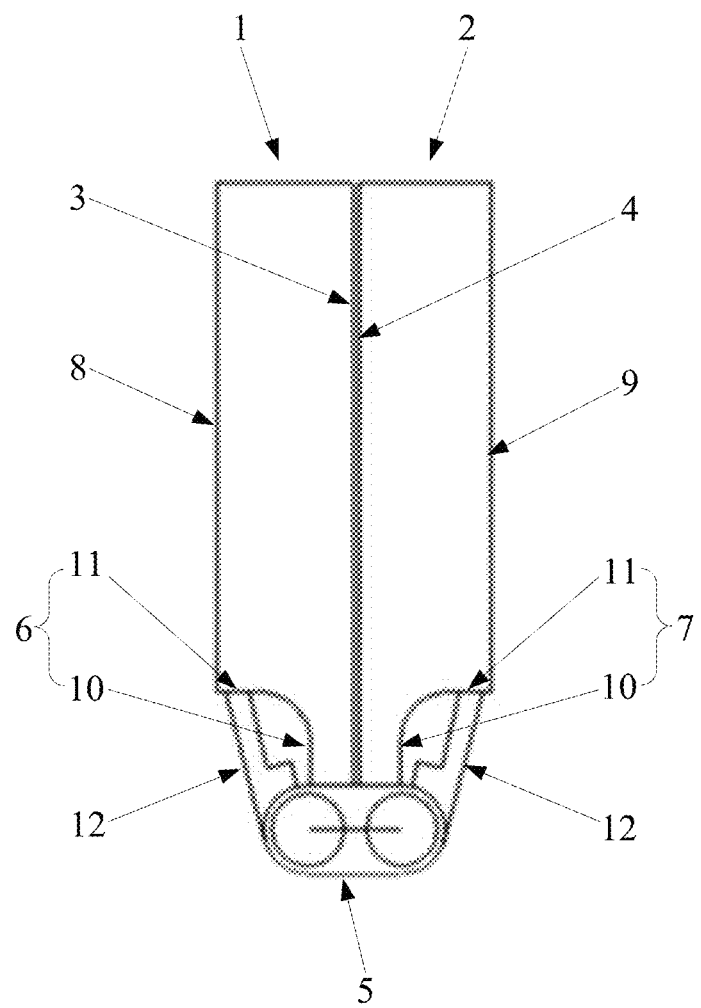
FIG. 3 is a main view of the electronic device at a second position.
Figure 4:
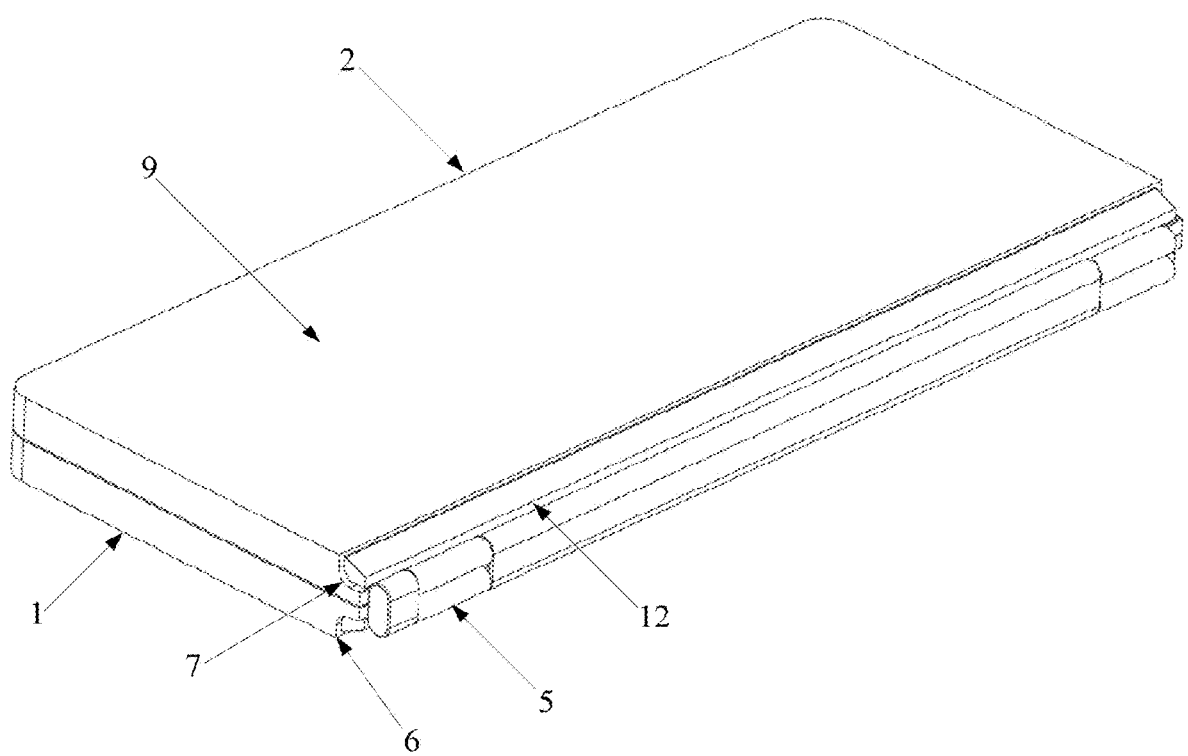
FIG. 4 is an isometric view of the electronic device of FIG. 3.

When the connection device 5 is the dual-axis linkage mechanism, to ensure that the first body 1 and the second body 2 can rotate relatively to the second position. That is, as shown in FIG. 3 and FIG. 4, the second position is when the angle between the first body 1 and the second body 2 is 360°. The first body 1 and the second body 2 forms the bottom wall of the accommodation groove (i.e., the section between two decoration pieces 12), and has an accommodation space. Components (i.e., the mounting piece 14 and connection part 19 of the second axial movement piece 16) of the connection device 5 can enter and be accommodated in the accommodation space, such that the mounting piece 14 and the connection part 19 of the second axial movement piece 16 partially overlap with the components of the first body 1 and the second body 2, which form the bottom wall of the accommodation groove, thereby the first body 1 and the second body 2 overlap with each other.

As shown in FIG. 3 and FIG. 4, when the electronic device is at the second position, since the mounting piece 14 and the connection part 19 of the second axial movement piece 16 enter the accommodation space, the first partial accommodation structure 6 and the second partial accommodation structure 7 no longer contain components. The first partial accommodation structure 6 and the second partial accommodation structure 7 are exposed at a surface of the electronic device, which affects the appearance aesthetics of the electronic device. To solve the problem, embodiments of the present disclosure provide the plate-shaped decoration pieces 12 at the connection device 5, which can extend into the first body 1 or the second body 2. The decoration pieces 12 can cover the first partial accommodation structure 6 or the second partial accommodation structure 7 by sliding relative to the first body 1 or the second body 2 to improve the appearance aesthetics of the electronic device. Sliding of the decoration pieces 12 relative to the first body 1 or the second body 2 is that, with a rotation of the first body 1 or the second body, the mounting piece 14 and the connection part 19 enter and exit the first partial accommodation structure 6 or the second partial accommodation structure 7. When the mounting piece 14 and the connection part 19 enter the first partial accommodation structure 6 or the second partial accommodation structure 7, the mounting piece 14 and the connection part 19 occupy the space of the first partial accommodation structure 6 or the second partial accommodation structure 7, and at this point, the decoration pieces 12 extend into the first body 1 and the second body 2 and are not exposed. When the mounting piece 14 and the connection part 19 exit the first partial accommodation structure 6 or the second partial accommodation structure 7, the decoration pieces 12 enter the space of the first partial accommodation structure 6 or the second partial accommodation structure 7 from the first body 1 or the second body 2 to cover the first partial accommodation structure 6 or the second partial accommodation structure 7. The embodiments have two decoration pieces 12, which are configured to cover the first partial accommodation structure 6 and the second partial accommodation structure 7, respectively.

Figure 12:
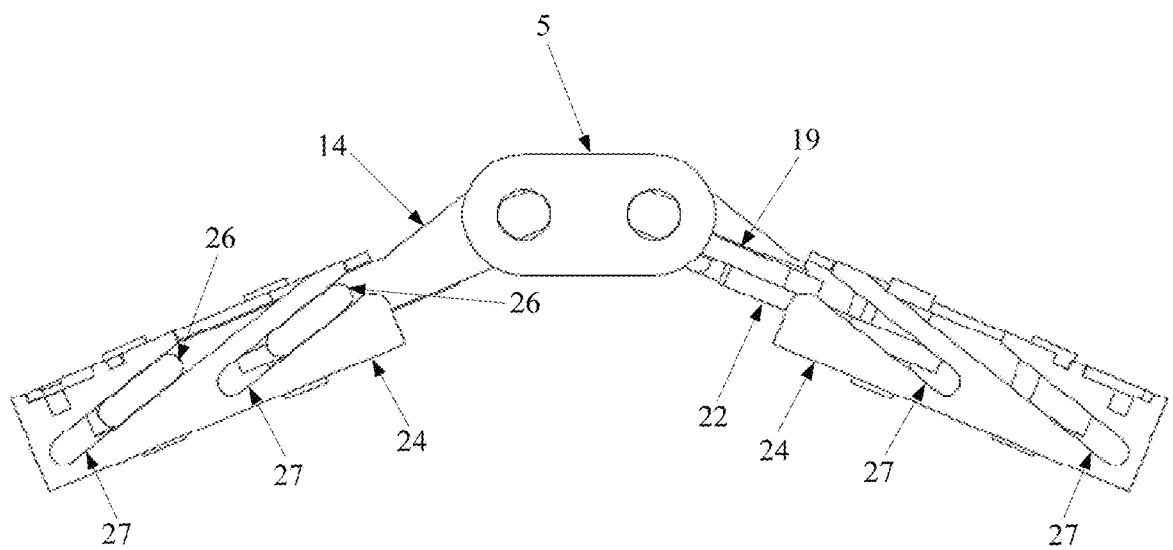
FIG. 12 is a schematic structural diagram of a coupling of a first sliding structure and a second sliding structure.

To realize a radial movement of the first body 1 or the second body 2 relative to the shaft 13, and at the same time, to cause the connection device 5 to move away from the display surface, in some embodiments, as shown in FIG. 12, a first sliding structure 26 is placed at the mounting piece 14 and a second sliding structure 27 is placed at the radial movement piece 24. The second sliding structure 27 is obliquely configured relative to the display surface at a plane perpendicular to the display surface, and the first sliding structure 26 and the second sliding structure 27 slidably cooperate with each other. The slidably cooperating first sliding structure 26 and the second sliding structure 27 guide the relative movement of the mounting piece 14 and the radial movement piece 24 in two directions. In some embodiments, the first sliding structure 26 and the second sliding structure 27 not only have a guidance function for the radial movement piece 24 sliding in directions of away from and towards the shaft 13, but also have a guidance function for the radial movement piece 24 in directions of away from and towards the mounting piece 14. Since the second sliding structure 27 is obliquely set, during the process that the radial movement piece 24 approaches or departs from the shaft 13, in a direction perpendicular to the display surface, a distance between the radial movement piece 24 and the mounting piece 14 also increases or decreases. Since the first body 1 or the second body 2 are placed at the radial movement piece 24, and the connection device 5 is placed at the mounting piece 14, a distance change between the radial movement piece 24 and the mounting piece 14 can realize a distance change between the connection device and the display surface. In some embodiments, the first sliding structure 26 is one of the second protrusion block and the second sliding groove, and the second sliding structure 27 is one of the second protrusion block and the second sliding groove.

Embodiments of the present disclosure further provide a connection device 5 configured to rotatably connect the first body 1 and the second body 2. A first display device is placed at the first surface 3 of the first body 1 and a second display device is placed at the second surface 4 of the second body 2. When the first surface 3 and the second surface 4 rotate in the same direction, the connection device 5 is under the display surface formed by the first surface 3 and the second surface 4 and is not exposed. The structure and function of the connection device 5 are the similar to the connection device 5 described above and will not be repeated herewith.

In this specification, a structure of each part is described in a progressive manner. The structure of each part focuses on differences from an existing structure. The overall and partial structure of the electronic device can be obtained by combining the structures of the described multiple parts.

The description of the disclosed embodiments enables those skilled in the art to implement or use the present disclosure. Various modifications to these embodiments are apparent to those skilled in the art, and general principles defined herein may be implemented in other embodiments without departing from the spirit or scope of the present disclosure. Therefore, the present disclosure is not limited to the embodiments shown in the specification, but should conform to the widest scope consistent with the principles and novel features disclosed in the specification.

What is claimed is:

1. An electronic device, comprising:
a first body, having a first surface and a third surface parallel to each other, a first display device being placed at the first surface;
a second body, having a second surface and a fourth surface parallel to each other, a second display device being placed at the second surface; and
a connection device, rotatably connecting the first body and the second body, wherein:
the electronic device has a first position when the first surface and the second surface facing a same direction at the first position and a second position when the first surface and the second surface facing each other;
the first body, at a first end close to the connection device, forms a first rounded L shape wall surface having a fifth surface close to the first surface and a seventh surface connecting with the third surface with the fifth surface and the seventh surface being two sides of the first L shape wall, and when measured from a bend of the first L shape wall, a length of the fifth surface is not shorter than a length of the seventh surface;
the second body, at a second end of the connection device, forms a second rounded L shape wall surface having a sixth surface is close to the second surface and an eighth surface connecting the fourth surface with the sixth surface and the eighth surface being two sides of the second L shape wall, when measured from a bend of the second L shape wall, a length of the sixth surface is not shorter than a length of the eighth surface;
at the first position, the first rounded L shaped wall surface and the second rounded L shaped wall surface are close to each other to form a first U shaped accommodation groove to accommodate the connection device, such that the connection device is covered by the display surface formed by the first surface and the second surface and the connection device is not exposed from a top of the first surface and the second surface; and
at the second position, the first rounded L shaped wall surface and the second rounded L shaped wall surface form a second U shaped accommodation groove and the connection device is completely accommodated into the second U shaped accommodation groove.

2. The electronic device of claim 1, wherein during a process of transitioning from the second position to the first position, a distance between the connection device and the first body or the second body decreases.

3. The electronic device of claim 2, wherein:
the connection device has a shaft; and
during a process of transitioning from the second position to the first position, the first body or the second body move in a radial direction of the shaft, and the connection device moves in a direction away from the display surface.

4. The electronic device of claim 3, wherein:
the shaft is configured to implement a rotatable connection of the first body and the second body;
the connection device includes an axial movement mechanism, placed at the shaft and moving along an axis of the shaft driven by the shaft; and
the connection device includes a radial movement mechanism, connecting the axial movement mechanism to the first body and moving along a radius of the shaft driven by the axial movement mechanism.

5. The electronic device of claim 4, wherein:
a mounting piece fixed to the shaft is configured to mount the radial movement mechanism, and a first sliding structure is placed at the mounting piece;
a second sliding structure is configured at a radial movement piece and is obliquely configured relative to the display surface at a plane perpendicular to the display surface; and
the first sliding structure and the second sliding structure are slidably coupled, the first body or the second body move in a radial direction of the shaft, and the connection device moves away from the display surface.

6. The electronic device of claim 1, wherein the electronic device has a third position.

7. The electronic device of claim 6, wherein:
an angle between the first body and the second body at the third position is different from an angle between the first body and the second body at the first position; and
the first rounded L shape wall surface and the second rounded L shape wall surface both form the accommodation groove to accommodate the connection device.

8. The electronic device of claim 6, wherein:
the second wall surface of the first partial accommodation structure and the second partial accommodation structure form an accommodating wall of the accommodation groove at the third position; and the first wall surface of the first rounded L shape wall surface and the first wall surface of the second rounded L shape wall surface form two side walls of the accommodation groove opposite to each other at the third position.

9. The electronic device of claim 6, wherein when the first surface and the second surface face a same direction, or the first surface and the second surface are opposite to each other, the first rounded L shape wall surface and the second rounded L shape wall surface form the accommodation groove to accommodate the connection device.

10. The electronic device of claim 6, wherein when the first surface and the second surface face the same direction:

the first wall surface of the first partial accommodation structure and the second partial accommodation structure form the accommodating wall of the accommodation groove, and the second wall surface of the first rounded L shape wall surface and the second wall surface of the second rounded L shape wall surface form two side walls of the accommodation groove opposite to each other, respectively.

11. The electronic device of claim 6, wherein when the first surface and the second surface are opposite to each other:

the second wall surface of the first rounded L shape wall surface and the second rounded L shape wall surface form an accommodating wall of the accommodation groove; and the first wall surface of the first rounded L shape wall surface and the first wall surface of the second rounded L shape wall surface form two side walls of the accommodation groove opposite to each other, respectively.

* * * * *